United States Patent [19]

Rhodes

[11] Patent Number: 4,698,125

[45] Date of Patent: Oct. 6, 1987

[54] METHOD OF PRODUCING A LAYERED STRUCTURE

[75] Inventor: Stephen J. Rhodes, Northampton, England

[73] Assignee: Plessey Overseas Limited, Ilford, England

[21] Appl. No.: 621,208

[22] Filed: Jun. 15, 1984

[30] Foreign Application Priority Data

Jun. 16, 1983 [GB] United Kingdom ............... 8316477

[51] Int. Cl.$^4$ ........................... B44C 1/22; C23F 1/02
[52] U.S. Cl. .................................. 156/643; 156/644;
156/655; 156/661.1; 156/668; 204/192.3;
204/192.32; 357/71; 430/314; 430/317;
439/228
[58] Field of Search ............... 156/643, 655, 668, 656,
156/657, 644, 659.1, 661.1; 29/578, 591, 589;
430/314, 317; 357/71, 67; 427/88, 89, 90, 91,
93; 204/192.14, 192.3, 192.32, 192.36

[56] References Cited

U.S. PATENT DOCUMENTS

| | | | |
|---|---|---|---|
| 3,985,597 | 10/1976 | Zielinski | 156/643 |
| 4,076,575 | 2/1978 | Chang | 156/656 X |
| 4,172,004 | 10/1979 | Alcorn et al. | 156/656 X |
| 4,367,119 | 1/1983 | Logan et al. | 156/643 |
| 4,410,622 | 10/1983 | Dalal et al. | 156/668 X |
| 4,536,249 | 8/1985 | Rhodes | 156/643 |
| 4,536,951 | 8/1985 | Rhodes et al. | 357/71 X |

OTHER PUBLICATIONS

Hitchner, J. E., "Chromium as an RIE Etch Barrier", IBM Techn. Discl. Bulle., vol. 22, No. 10, Mar. 1980, pp. 4516–4517.

Primary Examiner—Donald E. Czaja
Assistant Examiner—Ramon R. Hoch
Attorney, Agent, or Firm—Fleit, Jacobson, Cohn & Price

[57] ABSTRACT

A method of producing a layered structure, the method including forming a spacer layer on a substrate, forming a parting layer on the spacer layer, forming a first masking pattern on the parting layer the first masking pattern delineating field regions in a first metal layer, etching the spacer layer and the parting layer in accordance with the first masking pattern, depositing a first metal layer, depositing an etch barrier layer, dissolving the parting layer to remove the masking pattern and the first metal layer and etch barrier layer in the field regions, depositing a passivation layer on the spacer layer, depositing a dielectric layer on the passivation layer, forming a second masking pattern on the dielectric layer, exposing the etch barrier layer in accordance with the second masking pattern, depositing a second metal layer, forming a third masking pattern on the second metal layer and etching the second metal layer in accordance with the third masking pattern.

15 Claims, 8 Drawing Figures

NESTED VIA
PITCH = 2s + V + m

NON-NESTED VIA
PITCH = m + W OR
PITCH = V + g
WHICHEVER IS
THE GREATER

METHOD OF PRODUCING A LAYERED STRUCTURE

This invention relates to a method of producing a layered structure, which layered structure is used for forming electrical interconnections in an integrated circuit.

Integrated circuits, require the formation of layered structures comprising various levels of metal defining between them vias, that is metal to metal connections.

There are three factors which determine how the metal layers at each level are to be defined. These three factors are:
(1) Metal to metal spacing (m)
(2) Via size (v)
(3) Metal surround width around the via(s)

The metal pitch, which relates to the overall packing density is equal to:

$$m+v+2s$$

Normally, there are two considerations which require that the via be surrounded by metal both on first level metallisation and second level metallisation. Firstly, if the via is not contained within the first level metallisation, a gap is generally formed around the first level metal causing difficulties with second level metal step coverage within the via. These difficulties can result in excessive reductions in metal thickness in the connection between first and second level metal causing premature failure of the structure in use. Secondly, if the via surround is eliminated, problems can arise when, due to alignment tolerances, the second level metallisation does not completely cover the via. When this occurs, the first level metal is exposed in the via and may be etched during the etch process used to define the second level metal, resulting in excessive reductions in the thickness of the first level metal which may also cause premature failure of the structure in use.

It is an aim of the present invention to remove the need for a surround to the via, so removing this factor from the above-mentioned equation and thus affecting a significant improvement on the metallisation packing density.

Accordingly, this invention provides a method of producing a layered structure, which method comprises utilising a lift-off procedure for forming the first level metallisation, and providing an impervious top surface to the first level metallisation which forms an etch barrier between the first and second level metals.

The lift-off procedure for forming the first level metallization may be such that the majority of an insulating spacer layer is left remaining and such that the first level metal is provided by magnetron sputtering. This may provide a much improved connection between the first and second metal layers. Delineation problems associated with etching composite metal layers are avoided by the use of the lift-off method.

According to the present invention there is provided a method of producing a layered structure, the method comprising forming a spacer layer on a substrate, forming a parting layer on the spacer layer, forming a first masking pattern on the parting layer the first masking pattern delineating field regions in a first metal layer, etching the spacer layer and the parting layer in accordance with the first masking pattern, depositing a first metal layer, depositing an etch barrier layer, dissolving the parting layer to remove the masking pattern and the first metal layer and etch barrier layer in the field regions, depositing a passivation layer on the spacer layer, depositing a dielectric layer on the passivation layer, forming a second masking pattern on the dielectric layer, exposing the etch barrier layer in accordance with the second masking pattern, depositing a second metal layer, forming a third masking pattern on the second metal layer and etching the second metal layer in accordance with the third masking pattern.

Preferably, the metal layers are deposited by magneton sputtering.

The parting layer and the spacer layer may be etched by plasma etching.

Preferably, the plasma etching comprises oxygen plasma etching.

The formation of the via and the second level metallisation may be effected as set out in the method described in Great Britian patent application No. 2137808A and entitled "Integrated Circuit Processing Method". The disclosure in this co-pending patent application is incorporated herein by reference.

An embodiment of the invention will now be described solely by way of example and with reference to the accompanying drawings in which.

Figure 1:
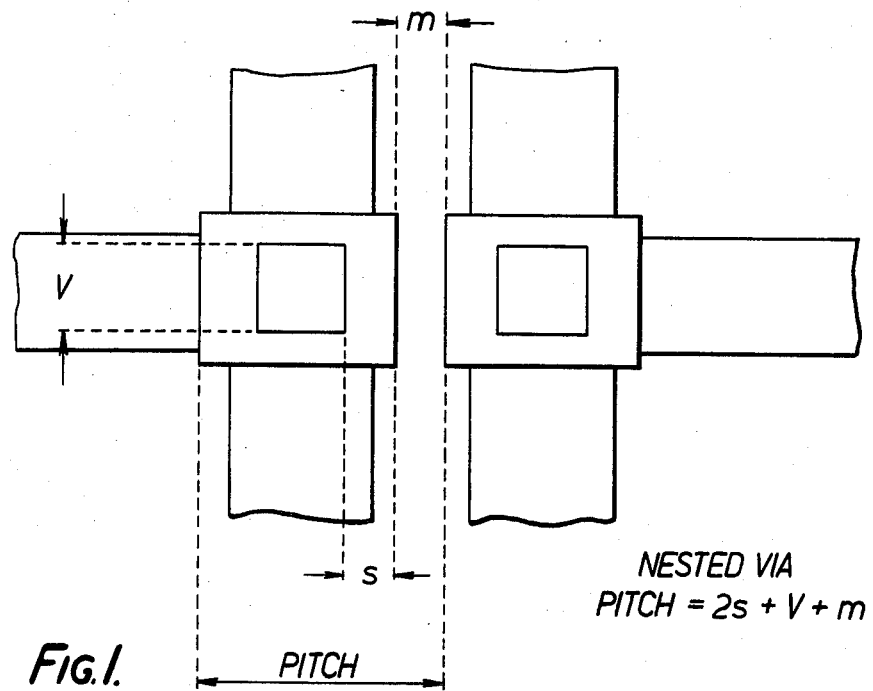
FIG. 1 illustrates a nested via and is for use in illustrating metallisation layout rules.
Figure 2:
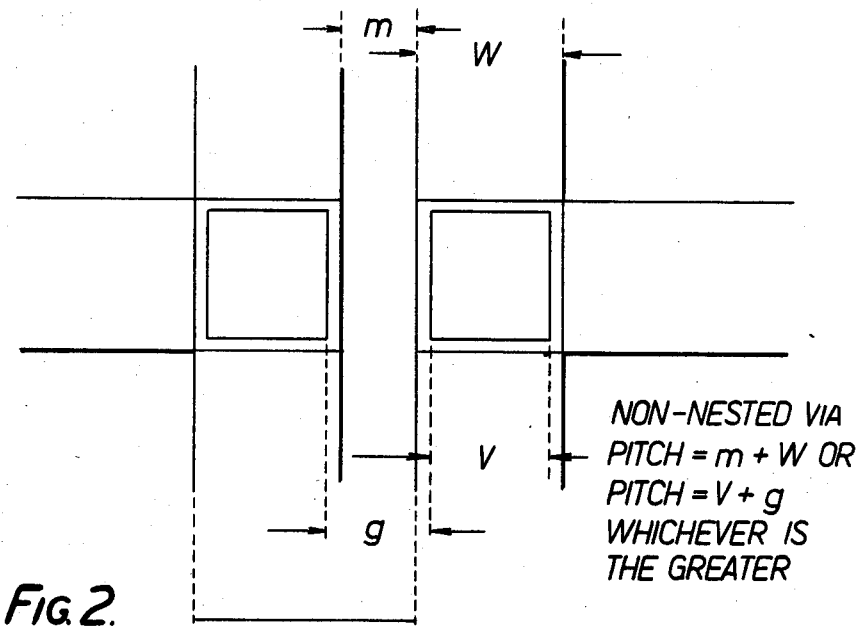
FIG. 2 illustrates a non-nested via and is for use in illustrating metallisation layout rules.

Referring to FIGS. 1 and 2, there is illustrated, for nested and non-nested vias, the metal to metal spacing (m), the via size (v), the metal surround around the via (s), the minimum metal width (w), and the via to via gap (g). For the nested via illustrated in FIG. 1, the metal pitch, which relates to the overall packing density, in an integrated circuit is equal to $m+v+2s$. In the non-nested via illustrated in FIG. 2, the metal pitch equals $m+w$ or $v+g$, whichever is the greater.

It can be seen by comparing FIGS. 1 and 2 that the via pitch with non-nested vias is smaller than that of nested vias. However, due to alignment tolerances present in current methods of forming vias, non-nested vias are more likely to give rise to defects in the resulting layered structure, as previously described.

Figure 3:
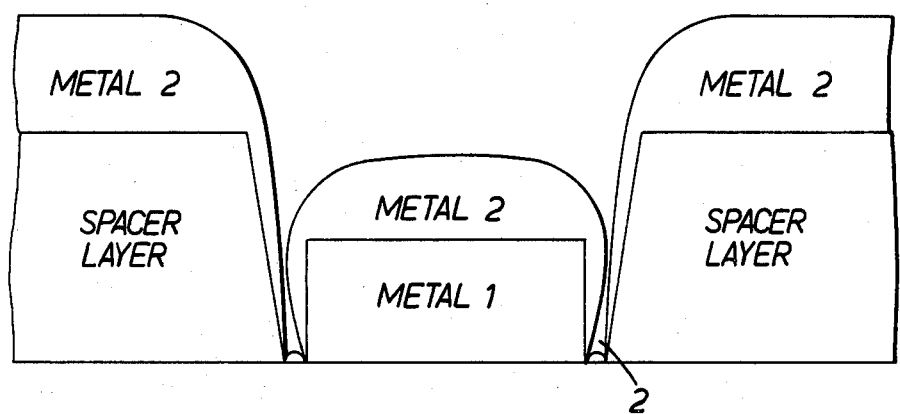
FIG. 3 illustrates the problems which can arise with second metal deposition if a via is not contained within the first level metallisation.

FIG. 3 shows the problem which can arise if the via is not contained within the first level metallisation. A gap 2 is formed around the first level metal which produces a steep sided and deep via in which it is extremely difficult to deposit the second metal layer. Often, the second metal layer contains portions having excessive reductions in metal thickness and micro-cracks are common.

Figure 4:
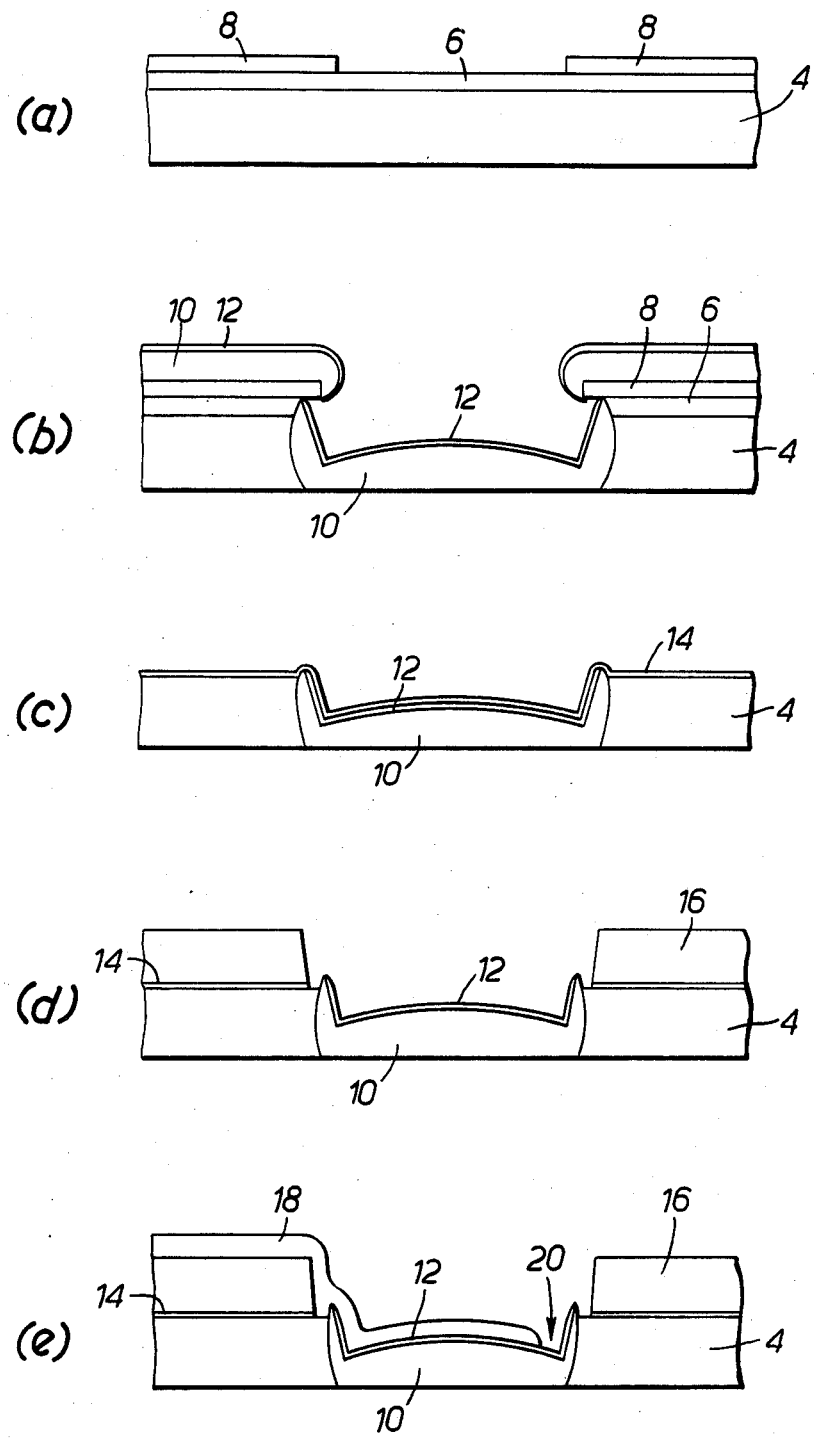
FIG. 4 illustrates a method of forming a via according to the present invention.

Referring now to FIG. 4, this Figure has been divided into five parts, namely FIGS. 4a, b, c, d and e.

Referring to FIG. 4a, it will be seen that a polyimide is coated and imidised onto a suitable substrate such as silicon to provide a spacer layer 4 for the first metal lift-off. A thin organic film in the form of a photo-resist film is spun onto the spacer layer 4 to act as a parting layer 6 for the lift-off procedure. An aluminium masking layer 8 is then deposited on the parting layer 6 and the field regions of the first layer metal are delineated in this masking layer 8 such that the masking layer 8 is etched where the first layer metal is required, to form a masking pattern.

Referring to FIG. 4b, the parting layer 6 and the spacer layer 4 are etched through the masking pattern in the masking layer 8 using an oxygen plasma etch to form a via in the spacer layer 4. The first layer metal 10 is now deposited by magnetron sputtering. The first layer metal is essentially pure or doped aluminium but it is covered with a thin layer of chromium to produce an etch barrier layer 12. It can be seen from FIG. 4b that at this stage of the process, the via contains a layer of the first metal 10 capped by the etch barrier layer 12.

Referring now to FIG. 4c, a lift-off is executed by dissolving the parting layer 6 in a suitable solvent, thus floating off the masking layer 8 and the first layer metal 10 and the etch barrier layer 12 over the field regions, exposing the surface of the spacer layer 4. A thin silicon passivation layer 14 is now deposited over the spacer layer 4 and the remaining first layer metal 10 and etch barrier layer 12. The passivation layer 14 acts to protect the spacer layer 6 during subsequent stages of the process. The passivation layer 14 may be 25 Å thick and it may be of another material such as for example titanium.

A dielectric layer 16 is now deposited on the passivation layer 14 and imidised. The dielectric layer 16 may comprise any suitable insulating material such as polyimide. When the dielectric layer is imidised the silicon passivation layer normally converts to silicon oxide. A masking pattern is then formed on the dielectric layer 16 and the dielectric layer 16 and the underlying passivation layer 14 are etched in accordance with the masking pattern to expose the etch barrier layer 12 in the via. The passivation layer 14 can be removed from within the via either by wet etching or back sputtering. This produces the structure shown in FIG. 4d of the accompanying drawings.

The layer of second level metal 18 is now deposited over the structure shown in FIG. 4d, with the interconnection between the second level metal 18 and the first level metal 10 being made in the via by means of the chromium etch barrier layer 12, as shown in FIG. 4e.

A masking pattern is then formed over the second level metal 18 and the second level metal is etched through the masking pattern to remove unwanted metal in field regions. The purpose of the chrome etch barrier layer 12 will now become clear. Due to alignment tolerances, the masking pattern used to enable selective etching of the second level metal 18 may not be aligned exactly with the via. If this misalignment occurs in the process, the second level metal 18, when etched, will be as shown in FIG. 4e.

The presence of the etch barrier layer 12 prevents the first level metal 10 being etched in the region 20 and hence, the excessive reductions in thickness of the first level metal, experienced with existing methods, do not occur.

The method of the invention provides a reliable method of achieving high density multi level metallisation by using non-nested vias. No factor for via surround is incorporated in the equation for metallisation pitch, thereby achieving a significant improvement in metallisation packing density. The method also incorporates a solution to first level metal attack and via step coverage problems that are ususally encountered when fabricating non-nested vias with current processing methods.

The method of the invention is particularly applicable to the provision of oxide isolated I²L integrated circuits where, with current techniques, metallisation packing density is limiting circuit density. It is to be appreciated however that the invention can also be used in most double level metallisation applications with similar benefits. The method of the invention can also be used for more than two levels of metal.

It is to be appreciated that the embodiment of the invention described above with reference to the accompanying drawings has been given by way of example alone in that modifications may be effected. Thus, for example, the masking layer 8 may be of a metal other than aluminium and the plasma etching of the parting layer 6 and the spacer layer 4 may be by a plasma etching other than oxygen plasma etching. The first layer metal is preferably aluminum or doped aluminium but other metals may be employed. Also, the first layer metal is preferable capped with chromium but again other metals may be employed.

I claim:

1. A method for producing a layered structure having non-nested vias, the method comprising:
   forming a spacer layer on a substrate,
   forming a parting layer on the spacer layer,
   forming a first masking pattern on the parting layer, the first masking pattern delineating field regions in a first metal layer,
   etching the spacer layer and the parting layer ion accordance with the first masking pattern to form openings in the spacer layer,
   depositing a first sputtered metal layer over the etched spacer layer and the openings formed therein,
   depositing an etch barrier layer on the first sputtered metal layer,
   dissolving the parting layer to remove the first masking pattern and the first sputtered metal layer and the etch barrier layer in the field regions to produce a structure having a first metallization pattern of the first metal layer and the etch barrier layer, the depositing of the first sputtered metal layer and the dissolving of the parting layer serving to provide the structure with a substantially planer surface for facilitating deposition of subsequent layers,
   depositing a passivation layer on the spacer layer and the first metallization pattern,
   depositing a dielectric layer on the passivation layer,
   forming a second masking pattern on the dielectric layer,
   exposing the etch barrier layer of the first metallization pattern in accordance with the second masking pattern, the passivation layer protecting the spacer layer in the field regions,
   depositing a second sputtered metal layer on the dielectric layer, the second sputtered metal layer extending in contact with the etch barrier layer of the first metallization pattern which was exposed by etching in accordance with the second masking pattern,
   forming a third masking pattern on the second sputtered metal layer, and
   etching the second sputtered metal layer in accordance with the third masking pattern to produce a second metallization pattern on the dielectric layer having a non-nested via extending into contact with the first metallization pattern.

2. A method according to claim 1 wherein the parting layer and the spacer layer are etched by plasma etching.

3. A method according to claim 2 wherein the plasma etching is oxygen plasma etching.

4. A method according to claim 1 wherein the parting layer is deposited by spinning.

5. A method according to claim 1 wherein the etch barrier layer is exposed by etching the passivation layer and the dielectric layer in accordance with the second masking pattern.

6. A method according to claim 1 wherein the etch barrier layer is exposed by etching the dielectric layer and back sputtering the passivation layer.

7. A method according to claim 1 wherein the spacer layer comprises polyimide.

8. A method according to claim 1 wherein the dielectric layer comprises polyimide.

9. A method according to claim 1 wherein the first masking pattern comprises an aluminium masking pattern.

10. A method according to claim 1 wherein the first and second metal layers comprise aluminium.

11. A method according to claim 1 wherein the passivation layer comprises silicon.

12. A method according to claim 1 wherein the passivation layer comprises titanium.

13. A method according to claim 1 wherein the parting layer comprises photo resist.

14. A method according to claim 1 wherein the etch barrier layer comprises chromium.

15. A method for producing a layered structure having non-nested vias, said method comprising:
   forming a spacer layer on a substrate,
   forming a parting layer on the spacer layer,
   forming a first masking pattern on the parting layer, the first masking pattern delineating field regions in a first metal layer,
   etching the spacer layer and the parting layer in accordance with the first masking pattern to form openings in the spacer layer,
   depositing a first sputtered metal layer on the first masking pattern and the substrate over the etched spacer layer and the openings formed therein,
   depositing an etch barrier layer on the first sputtered metal layer,
   dissolving the parting layer to remove the masking pattern, a portion of the first sputtered metal layer and a portion of the etch barrier layer in the field regions to produce a structure having a first metallization pattern of the first metal layer and the etch barrier layer, the depositing of the first sputtered metal layer and the dissolving of the parting layer serving to provide the structure with a substantially planer surface for facilitating deposition of subsequent layers,
   depositing a passivation layer on the spacer layer and the first metallization pattern,
   depositing a dielectric layer on the passivation layer,
   forming a second masking pattern on the dielectric layer,
   exposing the etch barrier layer of the first metallization pattern in accordance with the second masking pattern by etching the dielectric layer and the passivation layer, the passivation layer protecting the spacer layer in the field regions,
   depositing a second sputtered metal layer on the dielectric layer, the second sputtered metal layer extending in contact with the etch barrier layer of the first metallization pattern which was exposed by etching in accordance with the second masking pattern,
   forming a third masking pattern on the second sputtered metal layer, and
   etching the second sputtered metal layer in accordance with the third masking pattern to produce a second metallization pattern on the dielectric layer having a non-nested via extending into contact with the first metallization pattern.

* * * * *